(12) United States Patent
Shulman et al.

(10) Patent No.: US 11,327,656 B2
(45) Date of Patent: May 10, 2022

(54) ACCESSING A DYNAMIC MEMORY MODULE

(71) Applicant: Mobileye Vision Technologies Ltd., Jerusalem (IL)

(72) Inventors: Boris Shulman, Holon (IL); Yosef Kreinin, Jerusalem (IL); Leonid Smolyansky, Zichron Ya'akov (IL)

(73) Assignee: Mobileye Vision Technologies Ltd., Jerusalem (IL)

( * ) Notice: Subject to any disclaimer, the term of this patent is extended or adjusted under 35 U.S.C. 154(b) by 185 days.

(21) Appl. No.: 16/530,126

(22) Filed: Aug. 2, 2019

(65) Prior Publication Data
US 2020/0042191 A1 Feb. 6, 2020

Related U.S. Application Data

(60) Provisional application No. 62/714,449, filed on Aug. 3, 2018.

(51) Int. Cl.
*G06F 3/06* (2006.01)
*G06N 3/08* (2006.01)
(Continued)

(52) U.S. Cl.
CPC .......... *G06F 3/0608* (2013.01); *G06F 3/0659* (2013.01); *G06F 3/0673* (2013.01);
(Continued)

(58) Field of Classification Search
None
See application file for complete search history.

(56) References Cited

U.S. PATENT DOCUMENTS

2002/0138687 A1* 9/2002 Yang .................. G06F 13/1642
711/105
2016/0011785 A1* 1/2016 Yeh ....................... G06F 3/0619
711/103
(Continued)

FOREIGN PATENT DOCUMENTS

| WO | 02056187 | 7/2002 |
|----|----------|--------|
| WO | 2006058200 | 6/2006 |
| WO | 2020026030 | 2/2020 |

OTHER PUBLICATIONS

"International Application Serial No. PCT IB2019 000886, Invitation to Pay Additional Fees mailed Jan. 21, 2020", 13 pgs.
(Continued)

*Primary Examiner* — Charles Rones
*Assistant Examiner* — Jonah C Krieger
(74) *Attorney, Agent, or Firm* — Schwegman Lundberg & Woessner, P.A.

(57) ABSTRACT

A method for accessing a dynamic memory module, the method may include (i) receiving, by a memory controller, a set of access requests for accessing the dynamic memory module; (ii) converting the access requests to a set of commands, wherein the set of commands comprise (a) a first sub-set of commands that are related to a first group of memory banks, and (b) a second sub-set of commands that are related to a second group of memory banks; (iii) scheduling, by a scheduler of the memory controller, an execution of the first sub-set; (iv) scheduling an execution of the second sub-set to be interleaved with the execution of the first sub-set; and (v) executing the set of commands according to the schedule.

23 Claims, 15 Drawing Sheets

(51) Int. Cl.
    *H04N 5/247*     (2006.01)
    *G05D 1/00*     (2006.01)
    *G05D 1/02*     (2020.01)
    *B60W 10/04*     (2006.01)
    *B60W 10/18*     (2012.01)
    *B60W 10/20*     (2006.01)

(52) U.S. Cl.
    CPC ............ *B60W 10/04* (2013.01); *B60W 10/18* (2013.01); *B60W 10/20* (2013.01); *B60W 2420/42* (2013.01); *B60W 2420/54* (2013.01); *G05D 1/0088* (2013.01); *G05D 1/0221* (2013.01); *G05D 1/0246* (2013.01); *G05D 2201/0213* (2013.01); *G06N 3/08* (2013.01); *H04N 5/247* (2013.01)

(56) References Cited

U.S. PATENT DOCUMENTS

2019/0339908 A1* 11/2019 Ware .................. G11C 7/22
2020/0004588 A1* 1/2020 Sarkar ................ G06Q 10/06

OTHER PUBLICATIONS

"International Application Serial No. PCT IB2019 000886, International Search Report dated Mar. 17, 2020", 7 pgs.
"International Application Serial No. PCT IB2019 000886, Written Opinion dated Mar. 17, 2020", 12 pgs.

* cited by examiner

| OPCODE | ADDRESS | DATA | FLAG |
|---|---|---|---|
| PRE | | | ⚑ |
| ACT | | | |
| RD | | | |
| ACT | | | |
| WR | | | |
| | | | |
| | | | |
| | | | |
| | | | |
| REFRESH | | | ⚑ |
| | | | |
| | | | |

ACCESSING A DYNAMIC MEMORY MODULE

CLAIM OF PRIORITY

This application claims the benefit of priority to U.S. Provisional Application Ser. No. 62/714,449, filed Aug. 3, 2018, which is incorporated herein by reference in its entirety.

BACKGROUND

Advanced driver assistance systems (ADAS), and autonomous vehicle (AV) systems use cameras and other sensors together with object classifiers, which are designed to detect specific objects in an environment of a vehicle navigating a road. Object classifiers are designed to detect predefined objects and are used within ADAS and AV systems to control the vehicle or alert a driver based on the type of object that is detected its location, etc.

ADAS and AV systems are required to process a significant amount of information (such as image pixels) in real time. This may involve accessing dynamic memory modules that store the information.

Dynamic memory modules may include multiple memory banks. The multiple memory banks may be arranged in groups of memory banks.

Some dynamic memory modules, such as fifth generation low power memory devices (LPDDR5), impose a significant time gap between consecutive accesses to the same group of memory banks.

There is a growing need to allow a high-throughput access to information stored in dynamic memory modules of ADAS and AV systems.

SUMMARY

The following detailed description refers to the accompanying drawings. Wherever possible, the same reference numbers are used in the drawings and the following description to refer to the same or similar parts. While several illustrative embodiments are described herein, modifications, adaptations and other implementations are possible. For example, substitutions, additions, or modifications may be made to the components illustrated in the drawings, and the illustrative methods described herein may be modified by substituting, reordering, removing, or adding steps to the disclosed methods. Accordingly, the following detailed description may be not limited to the disclosed embodiments and examples.

Disclosed embodiments provide systems and methods that can be used as part of or in combination with autonomous navigation/driving and/or driver assist technology features. Driver assist technology refers to any suitable technology to assist drivers in the navigation and/or control of their vehicles, such as FCW; LDW and TSR, as opposed to fully autonomous driving.

BRIEF DESCRIPTION OF THE DRAWINGS

The accompanying drawings, which are incorporated in and constitute part of this disclosure, illustrate various disclosed embodiments. In the drawings:

FIG. 9 illustrates an example of various commands consistent with the disclosed embodiments;

DETAILED DESCRIPTION

Before discussing in detail examples of features of the error correction coding and memory management of a dynamic memory module of a system that may provide a variety of features related to autonomous driving, semi-autonomous driving and/or driver assist technology.

The system may be arranged to process images of an environment ahead of a vehicle navigating a road for training a neural networks or deep learning algorithms to estimate a future path of a vehicle based on images or feature of the processing of images of an environment ahead of a vehicle navigating a road using a trained neural network to estimate a future path of the vehicle.

There may be provided various possible implementations and configurations of a vehicle mountable system that can be used for carrying out and implementing the methods according to examples of the presently disclosed subject matter. In some embodiments, various examples of the system can be mounted in a vehicle and can be operated while the vehicle is in motion. In some embodiments, the system can implement the methods according to examples of the presently disclosed subject matter.

However, it would be appreciated that embodiments of the present disclosure are not limited to scenarios where a suspected upright object indication is caused by a high-grade road. The suspected upright object indication can be associated with various other circumstances and can result from other types of image data and also from data that is not image based or is not exclusively image based, as well.

Figure 1:
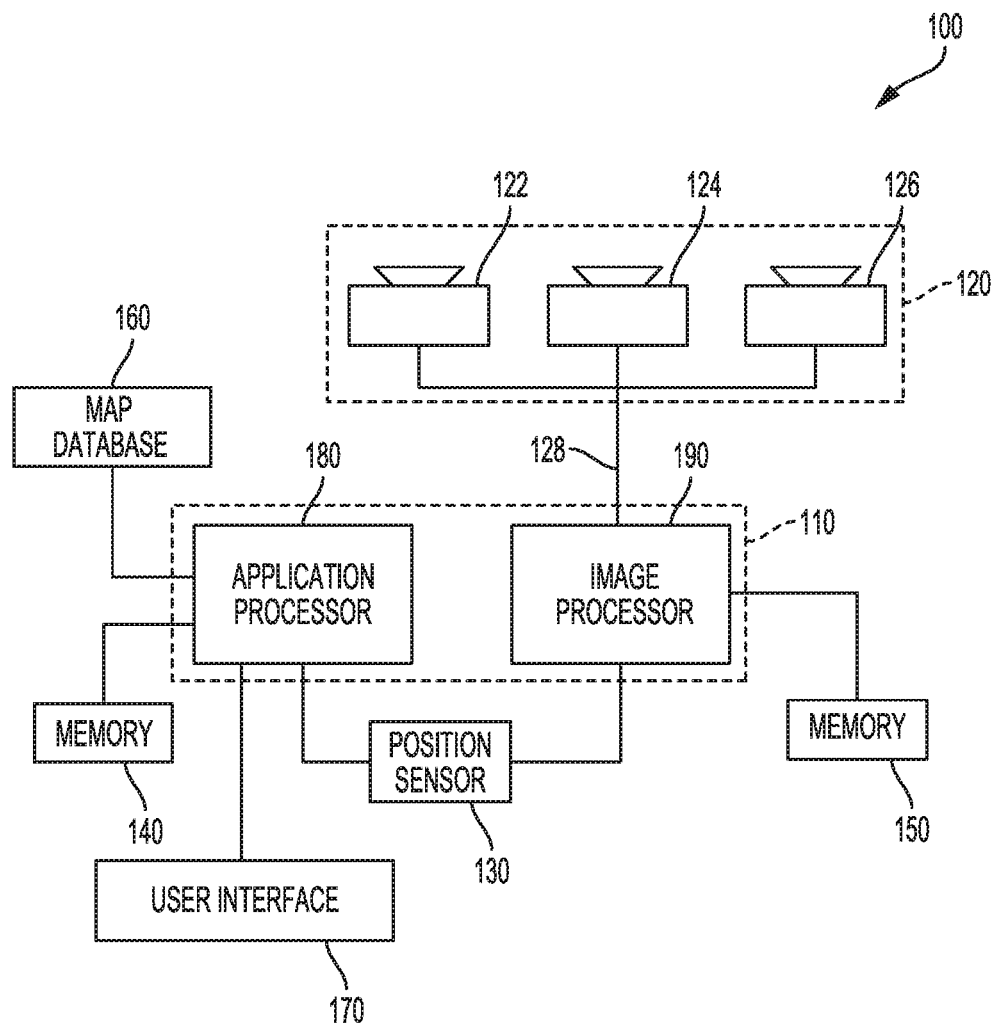
FIG. 1 is a block diagram representation of a system consistent with the disclosed embodiments.

FIG. 1, to which reference is now made, is a block diagram representation of a system consistent with the disclosed embodiments. System 100 can include various components depending on the requirements of a particular implementation. In some examples, system 100 can include a processing unit 110, an image acquisition unit 120 and one or more memory units 140, 150. Processing unit 110 can include one or more processing devices. In some embodiments, processing unit 110 can include an application processor 180, an image processor 190, or any other suitable processing device. Similarly, image acquisition unit 120 can include any number of image acquisition devices and components depending on the requirements of a particular application. In some embodiments, image acquisition unit 120 can include one or more image capture devices (e.g., cameras), such as image capture device 122, image capture device 124, and image capture device 126. In some embodiments, system 100 can also include a data interface 128 communicatively connecting processing unit 110 to image acquisition device 120. For example, data interface 128 can include any wired and/or wireless link or links for transmitting image data acquired by image acquisition device 120 to processing unit 110.

Both application processor 180 and image processor 190 can include various types of processing devices. For example, either or both of application processor 180 and image processor 190 can include one or more microprocessors, preprocessors (such as image preprocessors), graphics processors, central processing units (CPUs), support circuits, digital signal processors, integrated circuits, memory, or any other types of devices suitable for running applications and for image processing and analysis. In some embodiments, application processor 180 and/or image processor 190 can include any type of single or multi-core processor, mobile device microcontroller, central processing unit, etc. Various processing devices can be used, including, for example, processors available from manufacturers such as Intel®, AMD®, etc. and can include various architectures (e.g., x86 processor, ARM®, etc).

In some embodiments, application processor 180 and/or image processor 190 can include any of the EyeQ series of processor chips available from Mobileye®. These processor designs each include multiple processing units with local memory and instruction sets. Such processors may include video inputs for receiving image data from multiple image sensors and may also include video out capabilities. In one example, the EyeQ2® uses 90 nm-micron technology operating at 332 Mhz. The EyeQ2® architecture has two floating point, hyper-thread 32-bit RISC CPUs (MIPS32® 34K® cores), five Vision Computing Engines (VCE), three Vector Microcode Processors (VMP®), Denali 64-bit Mobile DDR Controller, 128-bit internal Sonics Interconnect, dual 16-bit Video input and 18-bit Video output controllers, 16 channels DMA and several peripherals. The MIPS34K CPU manages the five VCEs, three VMP™ and the DMA, the second MIPS34K CPU and the multi-channel DMA as well as the other peripherals. The five VCEs, three VMP® and the MIPS34K CPU can perform intensive vision computations required by multi-function bundle applications. In another example, the EyeQ3®, which is a third-generation processor and is six times more powerful that the EyeQ2®, may be used in the disclosed examples. In yet another example, the EyeQ4®, the fourth-generation processor, may be used in the disclosed examples.

While FIG. 1 depicts two separate processing devices included in processing unit 110, more or fewer processing devices can be used. For example, in some examples, a single processing device may be used to accomplish the tasks of application processor 180 and image processor 190. In other embodiments, these tasks can be performed by more than two processing devices.

Processing unit 110 can include various types of devices. For example, processing unit 110 may include various devices, such as a controller, an image preprocessor, a central processing unit (CPU), support circuits, digital signal processors, integrated circuits, memory, or any other types of devices for image processing and analysis. The image preprocessor can include a video processor for capturing, digitizing, and processing the imagery from the image sensors. The CPU can include any number of microcontrollers or microprocessors. The support circuits can be any number of circuits generally well known in the art, including cache, power supply, clock, and input-output circuits. The memory can store software that, when executed by the processor, controls the operation of the system. The memory can include databases and image processing software, including a trained system, such as a neural network, for example. The memory can include any number of random access memories, read only memories, flash memories, disk drives, optical storage, removable storage, and other types of storage. In one instance, the memory can be separate from the processing unit 110. In another instance, the memory can be integrated into the processing unit 110.

Each memory 140, 150 can include software instructions that when executed by a processor (e.g., application processor 180 and/or image processor 190), can control operation of various aspects of system 100. These memory units can include various databases and image processing software. The memory units can include random access memory, read only memory, flash memory, disk drives, optical storage, tape storage, removable storage, and/or any other types of storage. In some examples, memory units 140, 150 can be separate from the application processor 180 and/or image processor 190. In other embodiments, these memory units can be integrated into application processor 180 and/or image processor 190.

In some embodiments, the system can include a position sensor 130. The position sensor 130 can include any type of device suitable for determining a location associated with at least one component of system 100. In some embodiments, position sensor 130 can include a GPS receiver. Such receivers can determine a user position and velocity by processing signals broadcasted by global positioning system satellites. Position information from position sensor 130 can be made available to application processor 180 and/or image processor 190.

In some embodiments, the system 100 can be operatively connectable to various systems, devices and units onboard a vehicle in which the system 100 can be mounted, and through any suitable interfaces (e.g., a communication bus) the system 100 can communicate with the vehicle's systems. Examples of vehicle systems with which the system 100 can cooperate include: a throttling system, a braking system, and a steering system.

In some embodiments, the system 100 can include a user interface 170. User interface 170 can include any device suitable for providing information to or for receiving inputs from one or more users of system 100, including, for example, a touchscreen, microphone, keyboard, pointer devices; track wheels, cameras, knobs, buttons, etc. Information can be provided by the system 100, through the user interface 170, to the user.

In some embodiments, the system 100 can include a map database 160. The map database 160 can include any type of database for storing digital map data. In some examples, map database 160 can include data relating to a position, in a reference coordinate system, of various items, including roads, water features, geographic features, points of interest, etc. Map database 160 can store not only the locations of such items, but also descriptors relating to those items, including, for example, names associated with any of the stored features and other information about them. For example, locations and types of known obstacles can be included in the database, information about a topography of a road or a grade of certain points along a road, etc. In some embodiments, map database 160 can be physically located with other components of system 100. Alternatively or additionally, map database 160 or a portion thereof can be located remotely with respect to other components of system 100 (e.g., processing unit 110), in such embodiments, information from map database 160 can be downloaded over a wired or wireless data connection to a network (e.g., over a cellular network and/or the Internet, etc.).

Image capture devices 122, 124, and 126 can each include any type of device suitable for capturing at least one image from an environment. Moreover, any number of image capture devices can be used to acquire images for input to the image processor. Some examples of the presently disclosed subject matter can include or can be implemented with only a single-image capture device, while other examples can include or can be implemented with two, three, or even four or more image capture devices. Image capture devices 122, 124, and 126 will be further described with reference to FIGS. 2B-2E, below.

It would be appreciated that the system 100 can include or can be operatively associated with other types of sensors, including for example: an acoustic sensor, a RF sensor (e.g., radar transceiver), a LIDAR sensor. Such sensors can be used independently of or in cooperation with the image acquisition device 120. For example, the data from the radar system (not shown) can be used for validating the processed information that is received from processing images acquired by the image acquisition device 120, e.g., to filter certain false positives resulting from processing images acquired by the image acquisition device 120, or it can be combined with or otherwise compliment the image data from the image acquisition device 120, or some processed variation or derivative of the image data from the image acquisition device 120.

Figure 2A:
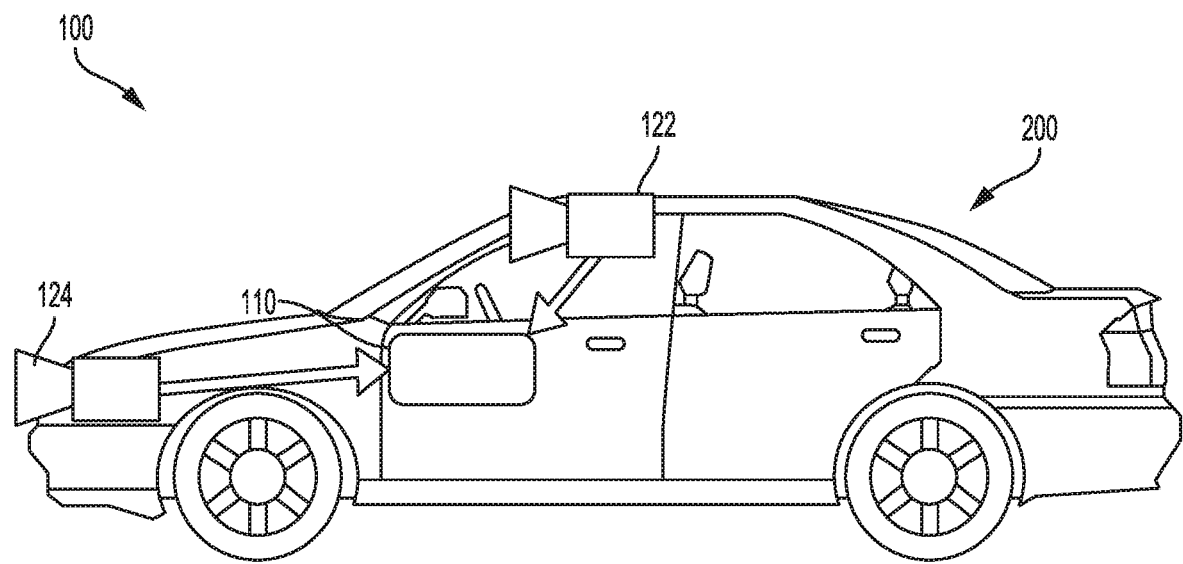
FIG. 2A is a diagrammatic side view representation of an exemplary vehicle including a system consistent with the disclosed embodiments.

System 100, or various components thereof, can be incorporated into various different platforms. In some embodiments, system 100 may be included on a vehicle 200, as shown in FIG. 2A. For example, vehicle 200 can be equipped with a processing unit 110 and any of the other components of system 100, as described above relative to FIG. 1. While in some embodiments vehicle 200 can be equipped with only a single-image capture device (e.g., camera), in other embodiments, such as those discussed in connection with FIGS. 2B-2E, multiple image capture devices can be used. For example, either of image capture devices 122 and 124 of vehicle 200, as shown in FIG. 2A, can be part of an ADAS (Advanced Driver Assistance Systems) imaging set.

The image capture devices included on vehicle 200 as part of the image acquisition unit 120 can be positioned at any suitable location. In some embodiments, as shown in FIGS. 2A-2E and 3A-3C, image capture device 122 can be located in the vicinity of the rearview mirror. This position may provide a line of sight similar to that of the driver of vehicle 200, which can aid in determining what is and is not visible to the driver.

Other locations for the image capture devices of image acquisition unit 120 can also be used. For example, image capture device 124 can be located on or in a bumper of vehicle 200. Such a location can be especially suitable for image capture devices having a wide field of view. The line of sight of bumper-located image capture devices can be different from that of the driver. The image capture devices (e.g., image capture devices 122, 124, and 126) can also be located in other locations. For example, the image capture devices may be located on or in one or both of the side mirrors of vehicle 200, on the roof of vehicle 200, on the hood of vehicle 200, on the trunk of vehicle 200, on the sides of vehicle 200, mounted on, positioned behind, or positioned in front of any of the windows of vehicle 200, and mounted in or near light figures on the front and/or back of vehicle 200, etc. The image capture unit 120, or an image capture device that is one of a plurality of image capture devices that are used in an image capture unit 120, can have a field-of-view (FOV) that is different than the FOV of a driver of a vehicle, and not always see the same objects. In one example, the FOV of the image acquisition unit 120 can extend beyond the FOV of a typical driver and can thus image objects which are outside the FOV of the driver. In yet another example, the FOV of the image acquisition unit 120 is some portion of the FOV of the driver. In some embodiments, the FOV of the image acquisition unit 120 corresponding to a sector which covers an area of a road ahead of a vehicle and possibly also surroundings of the road.

In addition to image capture devices, vehicle 200 can be include various other components of system 100. For example, processing unit 110 may be included on vehicle 200 either integrated with or separate from an engine control unit (ECU) of the vehicle. Vehicle 200 may also be equipped with a position sensor 130, such as a GPS receiver and may also include a map database 160 and memory units 140 and 150.

Figure 2B:
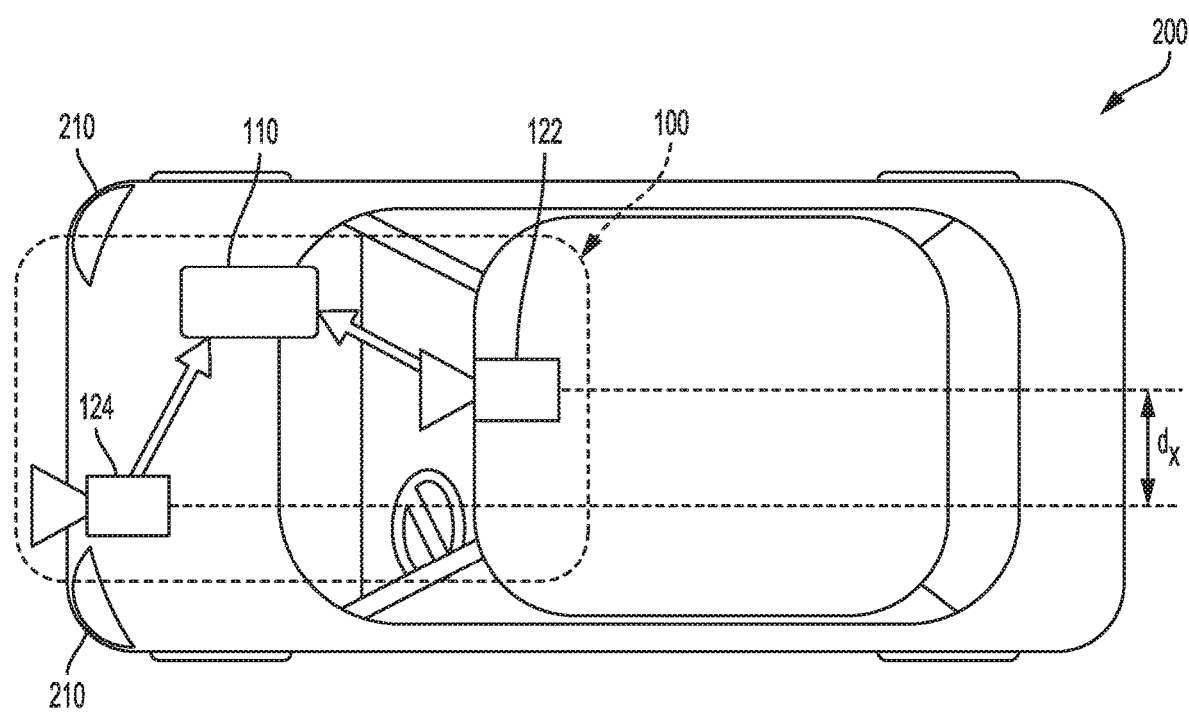
FIG. 2B is a diagrammatic top view representation of the vehicle and system shown in FIG. 2A consistent with the disclosed embodiments.

FIG. 2A is a diagrammatic side view representation of a vehicle imaging system according to examples of the presently disclosed subject matter. FIG. 2B is a diagrammatic top view illustration of the example shown in FIG. 2A. As illustrated in FIG. 2B, the disclosed examples can include a vehicle 200 including in its body a system 100 with a first image capture device 122 positioned in the vicinity of the rearview mirror and/or near the driver of vehicle 200, a second image capture device 124 positioned on or in a bumper region (e.g., one of bumper regions 210) of vehicle 200, and a processing unit 110.

Figure 2C:
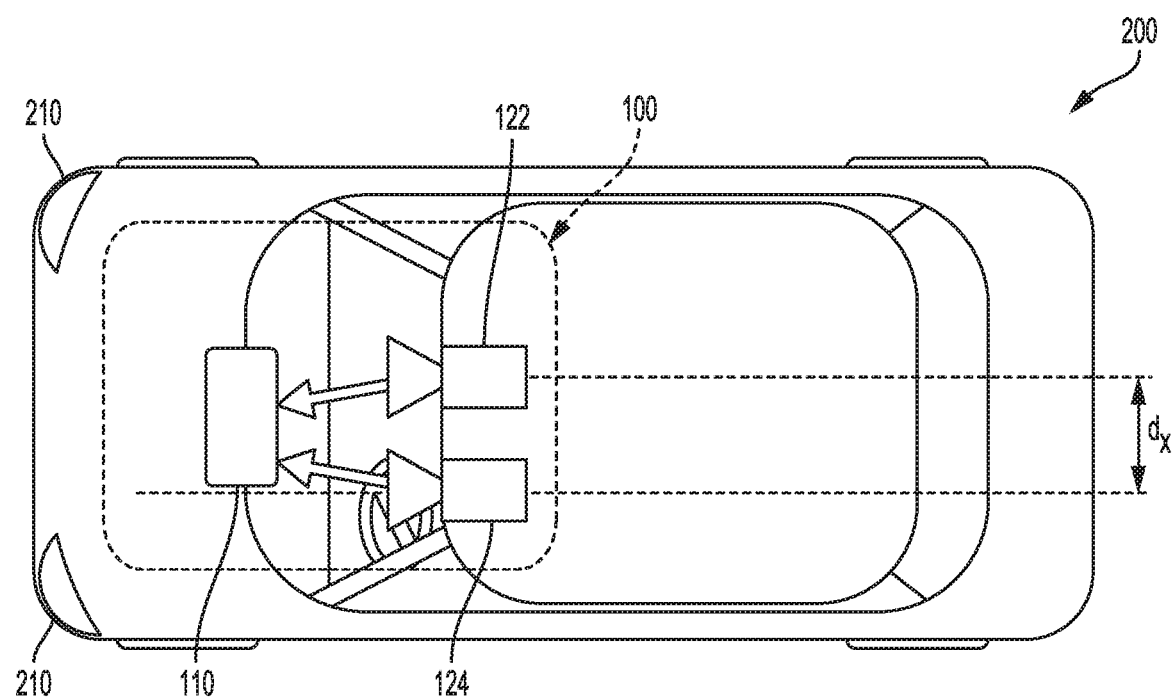
FIG. 2C is a diagrammatic top view representation of another embodiment of a vehicle including a system consistent with the disclosed embodiments.

As illustrated in FIG. 2C, image capture devices 122 and 124 may both be positioned in the vicinity of the rearview mirror and/or near the driver of vehicle 200. Additionally, while two image capture devices 122 and 124 are shown in FIGS. 2B and 2C, it should be understood that other embodiments may include more than two image capture devices. For example, in the embodiment shown in FIG. 2D, first, second, and third image capture devices 122, 124, and 126, are included in the system 100 of vehicle 200.

Figure 2D:
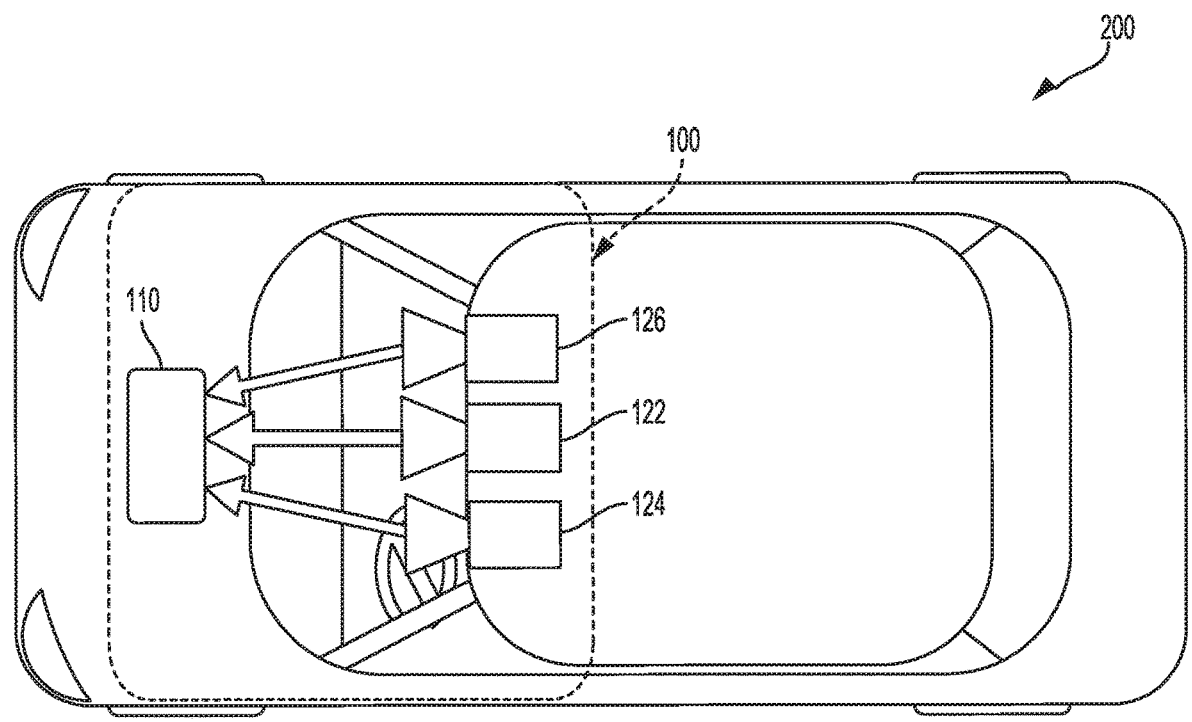
FIG. 2D is a diagrammatic top view representation of yet another embodiment of a vehicle including a system consistent with the disclosed embodiments.

As shown in FIG. 2D, image capture devices 122, 124, and 126 may be positioned in the vicinity of the rearview mirror and/or near the driver seat of vehicle 200. The disclosed examples are not limited to any particular number and configuration of the image capture devices, and the image capture devices may be positioned in any appropriate location within and/or on vehicle 200.

It is also to be understood that disclosed embodiments are not limited to a particular type of vehicle 200 and may be applicable to all types of vehicles including automobiles, trucks, trailers, motorcycles, bicycles, self-balancing transport devices and other types of vehicles.

The first image capture device 122 can include any suitable type of image capture device. Image capture device 122 can include an optical axis. In one instance, the image capture device 122 can include an Aptina M9V024 WVGA sensor with a global shutter. In another example, a rolling shutter sensor can be used. Image acquisition unit 120, and any image capture device which is implemented as part of the image acquisition unit 120, can have any desired image resolution. For example, image capture device 122 can provide a resolution of 1280×960 pixels and can include a rolling shutter.

Image acquisition unit 120, and any image capture device which is implemented as part of the image acquisition unit 120, can include various optical elements. In some embodiments one or more lenses can be included, for example, to provide a desired focal length and field of view for the image acquisition unit 120, and for any image capture device which is implemented as part of the image acquisition unit 120. In some examples, an image capture device which is implemented as part of the image acquisition unit 120 can include or be associated with any optical elements, such as a 6 mm lens or a 12 mm lens, for example. In some examples, image capture device 122 can be arranged to capture images having a desired (and known) field-of-view (FOV).

The first image capture device 122 may have a scan rate associated with acquisition of each of the first series of image scan lines. The scan rate may refer to a rate at which an image sensor can acquire image data associated with each pixel included in a particular scan line.

Figure 2E:
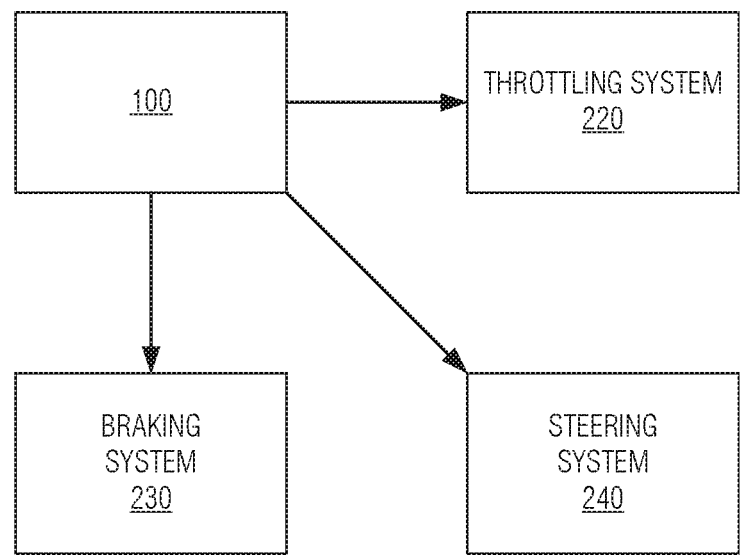
FIG. 2E is a diagrammatic representation of exemplary vehicle control systems consistent with the disclosed embodiments.

FIG. 2E is a diagrammatic representation of vehicle control systems, according to examples of the presently disclosed subject matter. As indicated in FIG. 2E, vehicle 200 can include throttling system 220, braking system 230, and steering system 240. System 100 can provide inputs (e.g., control signals) to one or more of throttling system 220, braking system 230, and steering system 240 over one or more data links (e.g., any wired and/or wireless link or links for transmitting data). For example, based on analysis of images acquired by image capture devices 122, 124, and/or 126, system 100 can provide control signals to one or more of throttling system 220, braking system 230, and steering system 240 to navigate vehicle 200 (e.g., by causing an acceleration, a turn, a lane shift, etc.). Further, system 100 can receive inputs from one or more of throttling system 220, braking system 230, and steering system 240 indicating operating conditions of vehicle 200 (e.g., speed, whether vehicle 200 is braking and/or turning, etc.).

Figure 3:
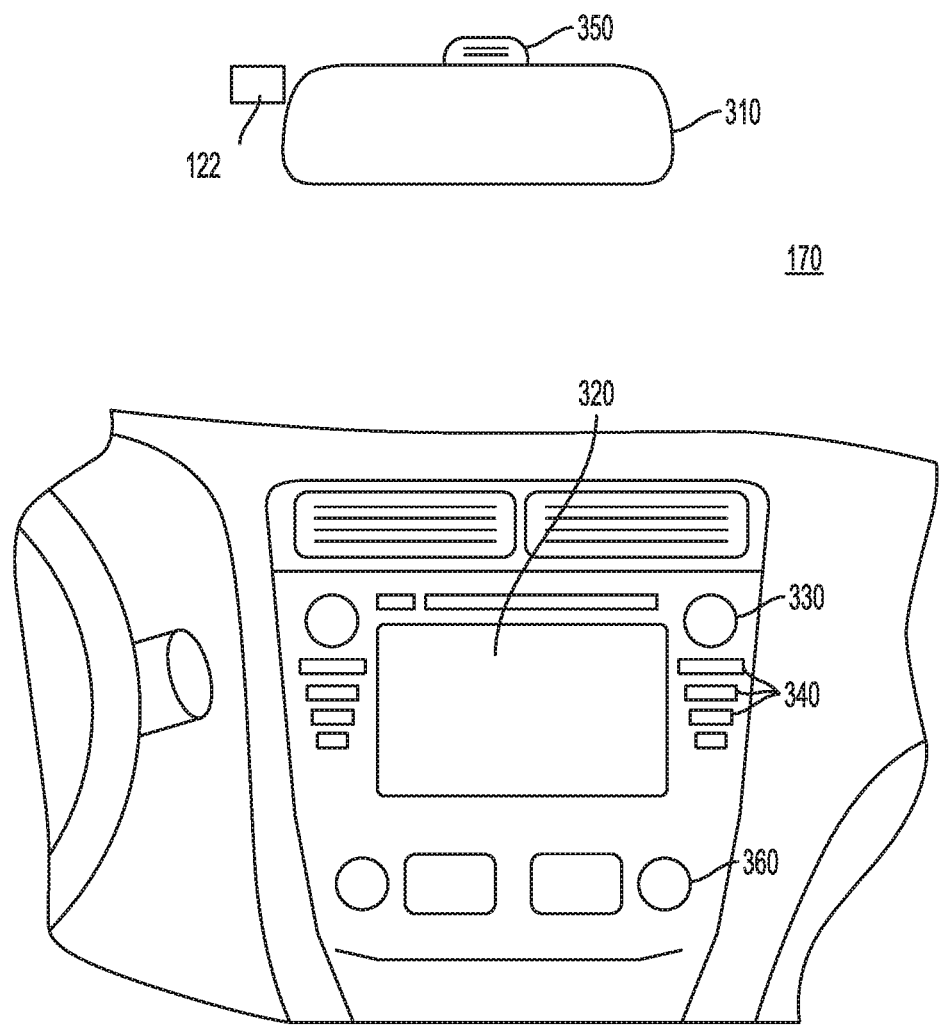
FIG. 3 is a diagrammatic representation of an interior of a vehicle including a rearview mirror and a user interface for a vehicle imaging system consistent with the disclosed embodiments.

As shown in FIG. 3, vehicle 200 may also include a user interface 170 for interacting with a driver or a passenger of vehicle 200. For example, user interface 170 in a vehicle application may include a touch screen 320, knobs 330, buttons 340, and a microphone 350. A driver or passenger of vehicle 200 may also use handles (e.g., located on or near the steering column of vehicle 200 including, for example, turn signal handles), buttons (e.g., located on the steering wheel of vehicle 200), and the like, to interact with system 100. In some embodiments, microphone 350 may be positioned adjacent to a rearview mirror 310. Similarly, in some embodiments, image capture device 122 may be located near rearview mirror 310. In some embodiments, user interface 170 may also include one or more speakers 360 (e.g., speakers of a vehicle audio system). For example, system 100 may provide various notifications (e.g., alerts) via speakers 360.

As will be appreciated by a person skilled in the art having the benefit of this disclosure, numerous variations and/or modifications may be made to the foregoing disclosed embodiments. For example, not all components are essential for the operation of system 100. Further, any component may be located in any appropriate part of system 100 and the components may be rearranged into a variety of configurations while providing the functionality of the disclosed embodiments. Therefore, the foregoing configurations are examples and, regardless of the configurations discussed above, system 100 can provide a wide range of functionality to analyze the surroundings of vehicle 200 and, in response to this analysis, navigate and/or otherwise control and/or operate vehicle 200. Navigation, control, and/or operation of vehicle 200 may include enabling and/or disabling (directly or via intermediary controllers, such as the controllers mentioned above) various features, components, devices, modes, systems, and/or subsystems associated with vehicle 200. Navigation, control, and/or operation may alternately or additionally include interaction with a user, driver, passenger, passerby, and/or other vehicle or user, which may be located inside or outside vehicle 200, for example by providing visual, audio, haptic, and/or other sensory alerts and/or indications.

As discussed below in further detail and consistent with various disclosed embodiments, system 100 may provide a variety of features related to autonomous driving, semi-autonomous driving and/or driver assist technology. For example, system 100 may analyze image data, position data (e.g., GPS location information), map data, speed data, and/or data from sensors included in vehicle 200. System 100 may collect the data for analysis from, for example, image acquisition unit 120, position sensor 130, and other sensors. Further, system 100 may analyze the collected data to determine whether or not vehicle 200 should take a certain action, and then automatically take the determined action without human intervention. It would be appreciated that in some cases, the actions taken automatically by the vehicle are under human supervision, and the ability of the human to intervene adjust abort or override the machine action is enabled under certain circumstances or at all times. For example, when vehicle 200 navigates without human intervention, system 100 may automatically control the braking, acceleration, and/or steering of vehicle 200 (e.g., by sending control signals to one or more of throttling system 220, braking system 230, and steering system 240). Further, system 100 may analyze the collected data and issue warnings, indications, recommendations, alerts, or instructions to a driver, passenger, user, or other person inside or outside of the vehicle (or to other vehicles) based on the analysis of the collected data. Additional details regarding the various embodiments that are provided by system 100 are provided below.

Figure 4:
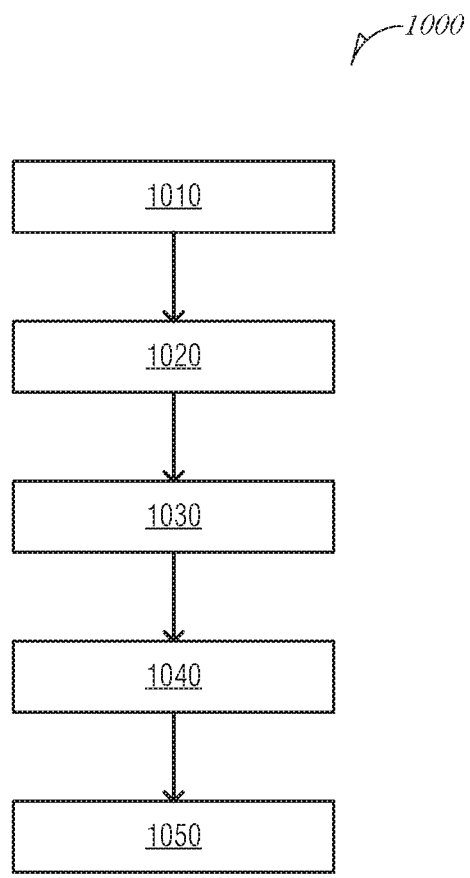
FIG. 4 illustrates a method consistent with the disclosed embodiments.

FIG. 4 illustrates an example of method 1000.

Method 1000 is for accessing a dynamic memory module. The dynamic memory module may belong to an ADAS system or an AV system. The dynamic memory module may be LPDDR5 dynamic memory module—or any other dynamic memory module.

The method may be applied on sequential accesses for example sequential reading or sequential writing of image data, filtering coefficients, instructions, and the like.

The dynamic memory controller may include multiple memory banks that are arranged in multiple groups of memory banks.

The dynamic memory module may include any number of memory banks per group, any number of overall memory banks, and there may be any number of memory banks per group.

The dynamic memory module may enforce a time gap between consecutive accesses to the same group of memory banks. This may be an inherent limitation of the dynamic memory module.

The time gap may be significant in the sense that its duration is of the order of a duration of a write or read operation of a burst of data atoms. The time gap may exceed the duration of the read or write operation of the burst of data atoms. The data atoms that are written (or read) during the burst may be regarded as a data sub-block.

Method 1000 may start by step 1010 of receiving, by a memory controller, a set of access requests for accessing the dynamic memory module.

The set of access requests may be received during or more periods of time. There may be any number of access requests.

Non-limiting examples of access requests include a read request, a write request, and the like.

The receiving of the set of access requests may include storing the one or more access requests in any manner. For example the set of access requests may be stored in one queue, in multiple queues, and the like. Different queues may be allocated to different memory banks and/or to different groups of memory banks.

Step 1010 may be followed by step 1020 of converting the set of access requests to a set of commands.

Figure 5:
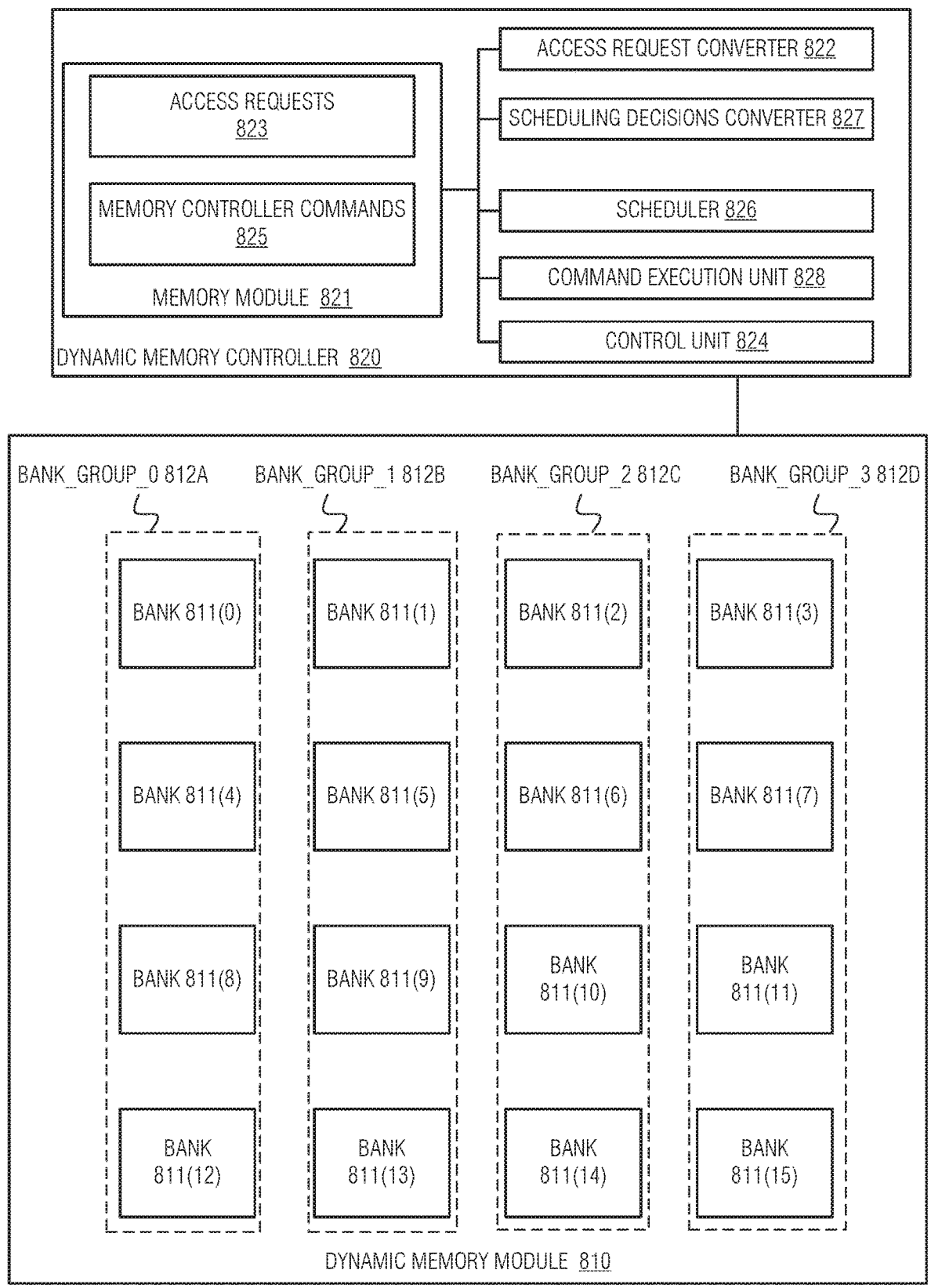
FIG. 5 is an example of a dynamic memory controller and of a dynamic memory module consistent with the disclosed embodiments.

The converting may be executed by a converter such as access request converter 822 of FIG. 5.

The converting may include, for example, generating commands that fulfill the access requests. The converting may include adding commands that facilitate the execution of the access requests. For example—the converting may include adding commands such as pre-charge, activate, and the like.

The commands of the set may be classified to data-related commands (such as read and write) and to management commands (such as pre-charge and activate) that are not related to data.

A data related command may refer to a sub-block of data. For example, a read command may be a command to read a data sub-block.

The maintaining of the same status of different memory banks of different groups of memory banks and the lack of associated data allows a reduction of the memory space required for storing management commands.

Accordingly, a management command related to the second group of memory banks may be represented by a flag or any other indicator that will be associated with a corresponding management command that is related to the first group of memory bank.

The representation of a management command by a flag or indicator may save memory space.

The set of commands may include multiple sub-sets of commands that are related to the multiple groups of memory banks.

For example, the set of commands may include (a) a first sub-set of commands that are related to a first group of memory banks, and (b) a second sub-set of commands that are related to a second group of memory banks.

Step 1020 may be followed by step 1030 of scheduling, by a scheduler of the memory controller, an execution of the first sub-set.

Any scheduling method may be applied.

The scheduler may perform the scheduling without reading (or without taking into account) the second sub-set. This may save either time or allow the scheduler to operate at a lower frequency.

The scheduling may be regarded as a bottleneck of the access process as the scheduler may be required to scan a large number of commands per each scheduling cycle. By skipping some of the commands of the set, this may unblock the bottleneck.

Step 1030 may be followed by step 1040 of scheduling an execution of the second sub-set to be interleaved with the execution of the first sub-set.

The interleaving contributes to the maintaining of the same status between different memory banks (or at least between corresponding memory banks that belong to different groups of memory banks).

Step 1040 may be executed by an entity that differs from the scheduler. This entity may be a converter that may convert each command of the first sub-set to a pair of commands—a command of the sub-set of the commands and a corresponding command of the second sub-set of the commands. The first and second commands of the pair may share an operand.

The converter may be, for example, the scheduling decisions converter 827 of FIG. 5.

It should be noted that steps 1030 and 1040 may be executed so that after the scheduling of one or more commands of the first sub-set, the method may schedule the execution of one or more corresponding commands of the second sub-set.

Step 1040 may be executed by adding, to each scheduler decision about a timing of execution of a first command of the first sub-set, another decision regarding a timing of an execution of a second command of the second sub-set, so that the execution of the second command immediately follows the execution of the first command.

The interleaving of the first and second command causes the first and second groups of memory banks (or at least a first memory bank of the first group and a second memory bank of the second group) to have substantially the same status. The same status allows the scheduler to schedule the execution of the commands of the first sub-set while ignoring the commands of the second sub-set.

Step 1040 may be followed by step 1050 of executing the set of commands according to the schedule.

FIG. 5 is an example of a dynamic memory controller 820 and of a dynamic memory module 810.

For simplicity of explanation, it is assumed that there are four groups of memory banks and four memory banks per group. This is merely a non-limiting example of the number of groups of memory banks and of the number of memory banks per group of memory banks.

Dynamic memory module 810 includes sixteen memory banks Bank 811(0)-Bank 811(15) that are arranged in four groups of memory banks—Bank_Group_0 812A, Bank_Group_1 812B, Bank_Group_2 8120, and Bank_Group_3 812D.

First group of memory banks Bank_Group_0 812A includes first, fifth, ninth and thirteenth memory banks 811(0), 811(4), 811(8) and 811(12).

Second group of memory banks Bank_Group_1 812B includes second, sixth, tenth and fourteenth memory banks 811(1), 811(5), 811(9) and 811(13).

Third group of memory banks Bank_Group_2 812C includes third, seventh, eleventh and fifteenth memory banks 811(2), 811(6), 811(10) and 811(14).

Fourth group of memory banks Bank_Group_3 812D includes fourth, eighth, twelfth and sixteenth memory banks 811(3), 811(7), 811(11) and 811(15).

Any other mapping between memory banks and group of memory banks may be provided.

It is assumed that a sequential writing of data sub-blocks is converted to an interleaved writing of the data sub-blocks between the different groups of memory banks—so that the sequential writing is not penalized by the time gap introduced between successive writing to the same group.

For example—a first sequence of data sub-blocks may be written in an interleaved manner to the first and second groups of memory banks Bank_Group_0 812A and Bank_Group_1 812B.

In addition—and even parallel to the writing of the first sequence—a second sequence of data sub-blocks may be written in an interleaved manner to the third and fourth groups of memory banks Bank_Group_2 812C and Bank_Group_3 812D.

The dynamic memory controller 820 includes a memory module 821, converter 822, control unit 824, scheduler 826, scheduling decision converter 827, and command execution unit 828.

The dynamic memory controller 820 may include one or more integrated circuits. The memory module 821, converter 822, control unit 824, scheduler 826, scheduling decision converter 827, and command execution unit 828 may be included in the one or more integrated circuits, may include one or more hardware accelerators, may be included in one or more processing circuits, wherein the one or more processing circuits may be constructed and arranged (for example be programmed, have certain structures, certain connectivity, and the like) to execute at least some of the steps of method 1000.

Memory module 821 may store access requests 823 and memory controller commands ("commands") 825.

Converter 822 may be constructed and arranged to execute step 1020 of method 1000. Accordingly, converter 822 may be constructed and arranged to convert the set of access requests 823 to a set of commands 825.

Converter 822 may be constructed and arranged to generate pairs of management commands. Each pair of management commands may include (a) a first management command that is associated with the first group of memory banks, and (b) a second management command that is associated with the second group of memory banks. The converter 822 may be constructed and arranged to generate a compressed representation of the pair of management commands.

The set of commands may include (a) a first sub-set of commands that are related to a first group of memory banks, and (b) a second sub-set of commands that are related to a second group of memory banks.

Scheduler 826 may be constructed and arranged to execute step 1030 of method 1000.

Scheduler 826 may be constructed and arranged to schedule an execution of the first sub-set. This can be executed without reading the second sub-set.

Scheduling decision converter 827 may be constructed and arranged to execute step 1040 of method 1000.

Scheduling decision converter 827 may be constructed and arranged to schedule an execution of the second sub-set to be interleaved with the execution of the first sub-set.

Command execution unit 828 may be constructed and arranged to execute step 1050 of method 1000.

Command execution unit 828 may be constructed and arranged to execute the set of commands according to the schedule. This may include, for example, pre-charging, read and/or write operations, activating, refreshing, and the like.

Figure 6:
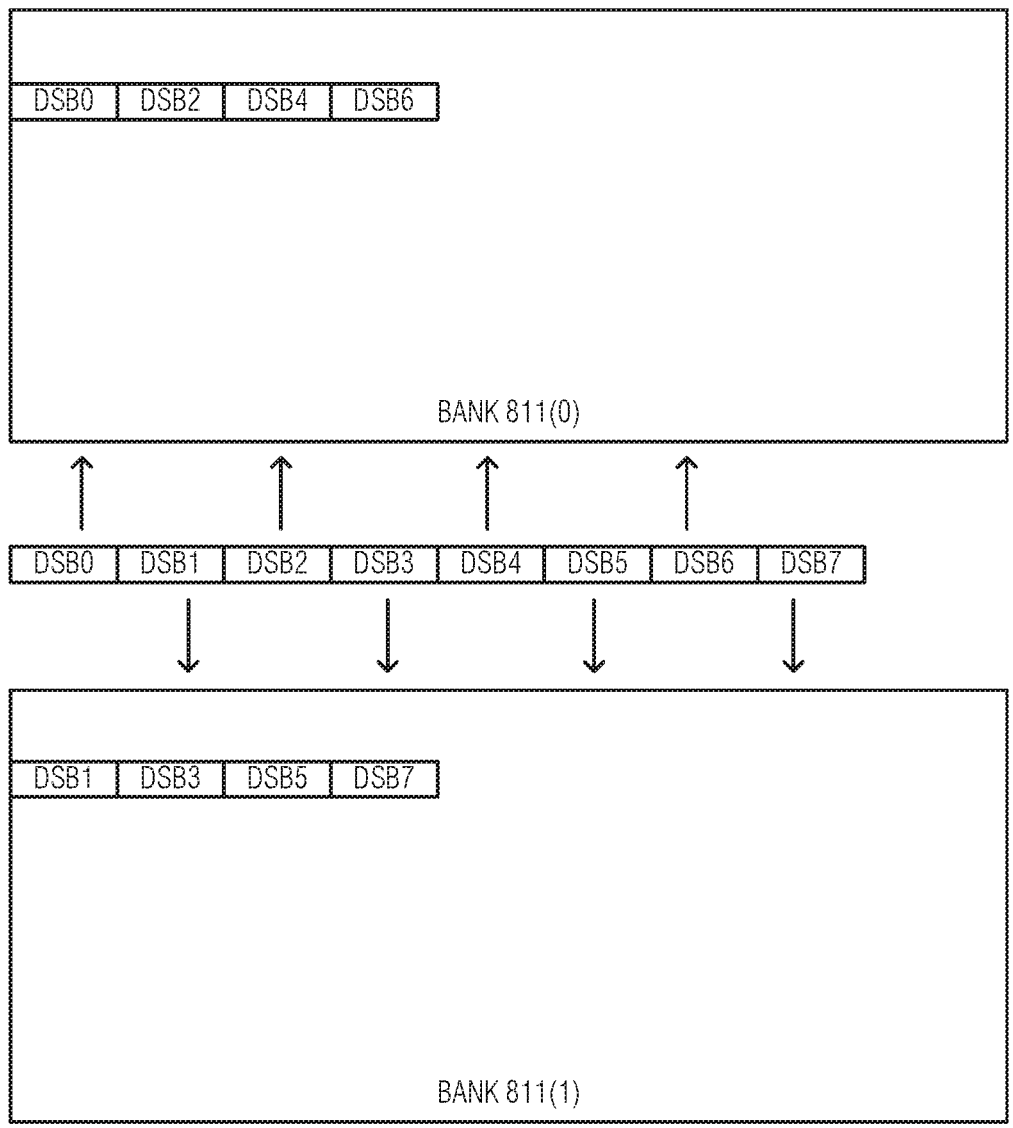
FIG. 6 illustrates a sequence of data sub-blocks DSB0-DSB7 that are written in an interleaved manner to first and second memory banks consistent with the disclosed embodiments.

FIG. 6 illustrates a sequence of data sub-blocks DSB0-DSB7 that are written in an interleaved manner to first and second memory banks 811(0) and 811(1).

Figure 7:
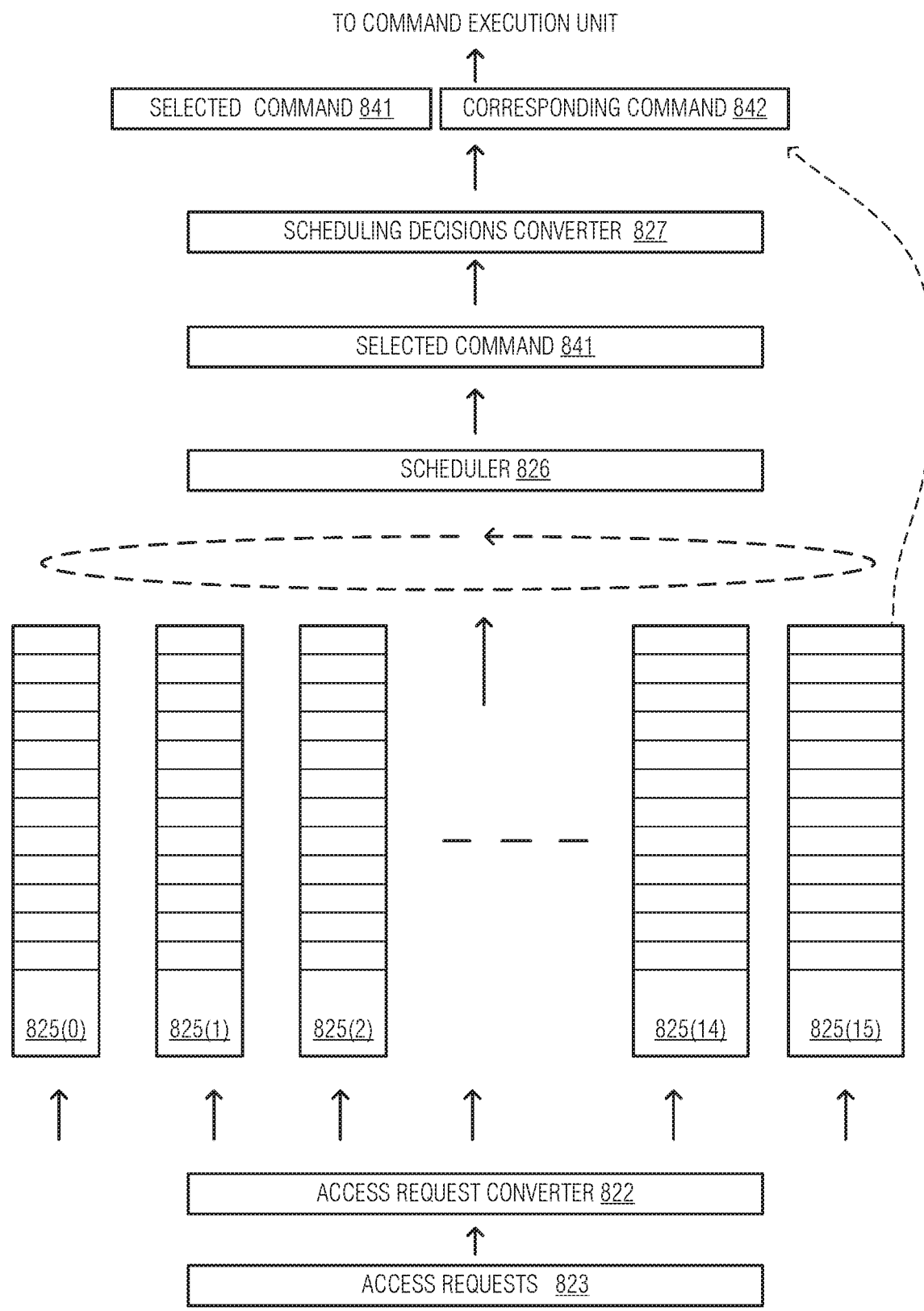
FIG. 7 illustrates an example of a process consistent with the disclosed embodiments.

FIG. 7 illustrates an example of a process.

A set of access requests 823 are fed to access request converter 822 that converts the set of access requests 823 to a set of commands that are stored in multiple queues—especially sixteen queues—825(0) to 825(15) that are associated with the sixteen memory banks 811(0) to 811(15).

Scheduler 826 may access only some of these queues 825 in order to schedule only some of the commands. For example, assuming that the scheduler 826 has to schedule the first sub-set that are related to a first group of memory banks, then the scheduler 826 may access the queues 825 that store the first sub-set without accessing the queues that store the second sub-set.

For example, the scheduler 826 may access queues 825(0), 825(4), 825(8), and 825(12) and not access queues 825(1), 825(5), 825(9), and 825(13).

In another example, scheduler 826 may also access 825(2), 825(6), 825(10), and 825(14) and not access queues 825(3), 825(7), 825(11), and 825(15).

The scheduler 826 may output, during each scheduling iteration, a selected command 841.

The scheduling decisions converter 827 may convert the selected command 841 to a pair of commands that includes the selected command 841 and a corresponding command 842. The selected command 841 and the corresponding command 842 are aimed to different groups of memory banks 811. The corresponding command 842 may be retrieved from the queues 825 not accessed by the scheduler 826.

The selected command 841 and the corresponding command 842 are executed by the command execution unit 828.

Figure 8:
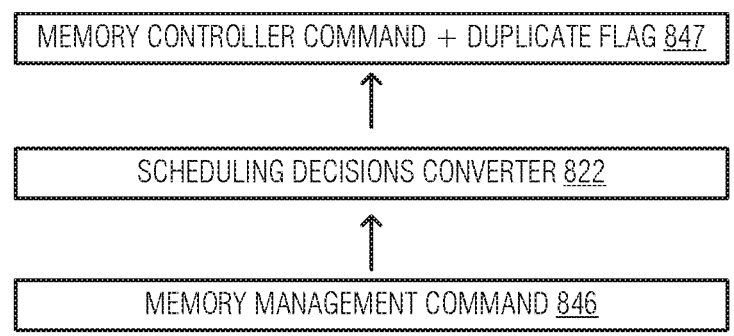
FIG. 8 illustrates an example of a generation of a compressed representation of a pair of management commands consistent with the disclosed embodiments.

FIG. 8 illustrates an example of a generation of a compressed representation of a pair of management commands.

Memory management command 846 is converted, by scheduling decision converter 822, to a memory controller command and an indicator (collectively denoted 847). The indicator may be a duplicate flag that indicates that the execution of the memory management command 846 should be immediately followed by the execution of a same memory management command, which will be aimed to another group of memory banks.

FIG. 9 illustrates an example of various commands.

FIG. 9 illustrates a portion 825(0) of the memory controller commands 825 of FIG. 5.

Each command may include an opcode (such as PRE—precharge, ACT—activate, RD—read, WR—write, and REFRESH—refresh), address bits; data (when applicable) and a flag (when applicable).

Management commands such as pre-charge and refresh also include a duplicate flag that indicates that they should be duplicated for one or more other groups of memory banks.

For example, a first PRE command that is aimed to a first memory bank of the first group of memory banks may include a duplicate flag. Accordingly, when the scheduler determines to execute the first PRE command, the dynamic memory controller also generates a second PRE command that is aimed to the second memory bank of the second group of memory banks- and schedules the second PRE command to be executed immediately after the execution of the first PRE command.

The interleaving may be applicable when the dynamic memory module is used to store error correction code (ECC).

Figure 10:
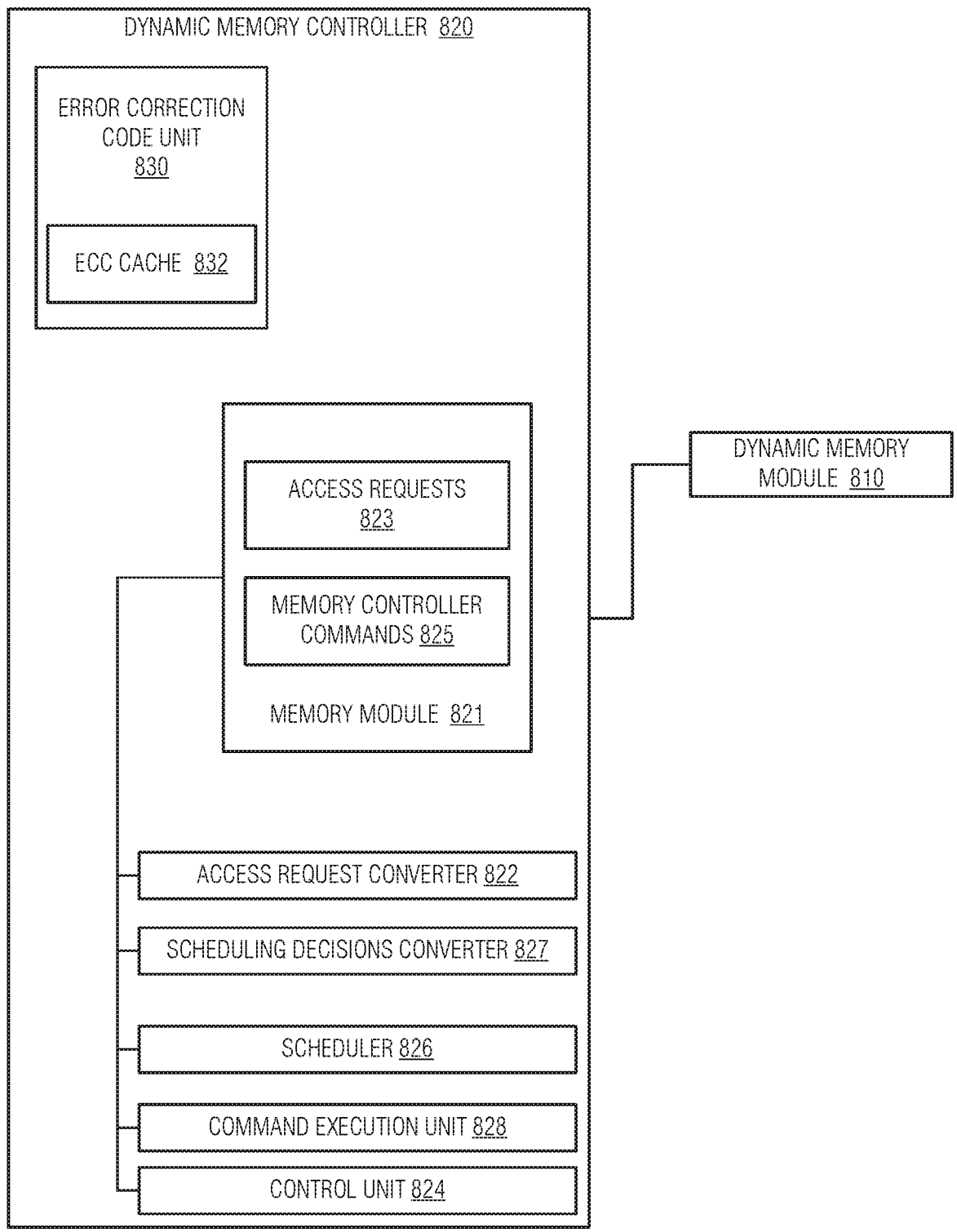
FIG. 10 illustrates dynamic memory controller consistent with the disclosed embodiments.

FIG. 10 illustrates that the dynamic memory controller 820 may include an error correction code unit 830 that includes an ECC cache 832 for storing error correction codes sub-blocks.

Figure 11:
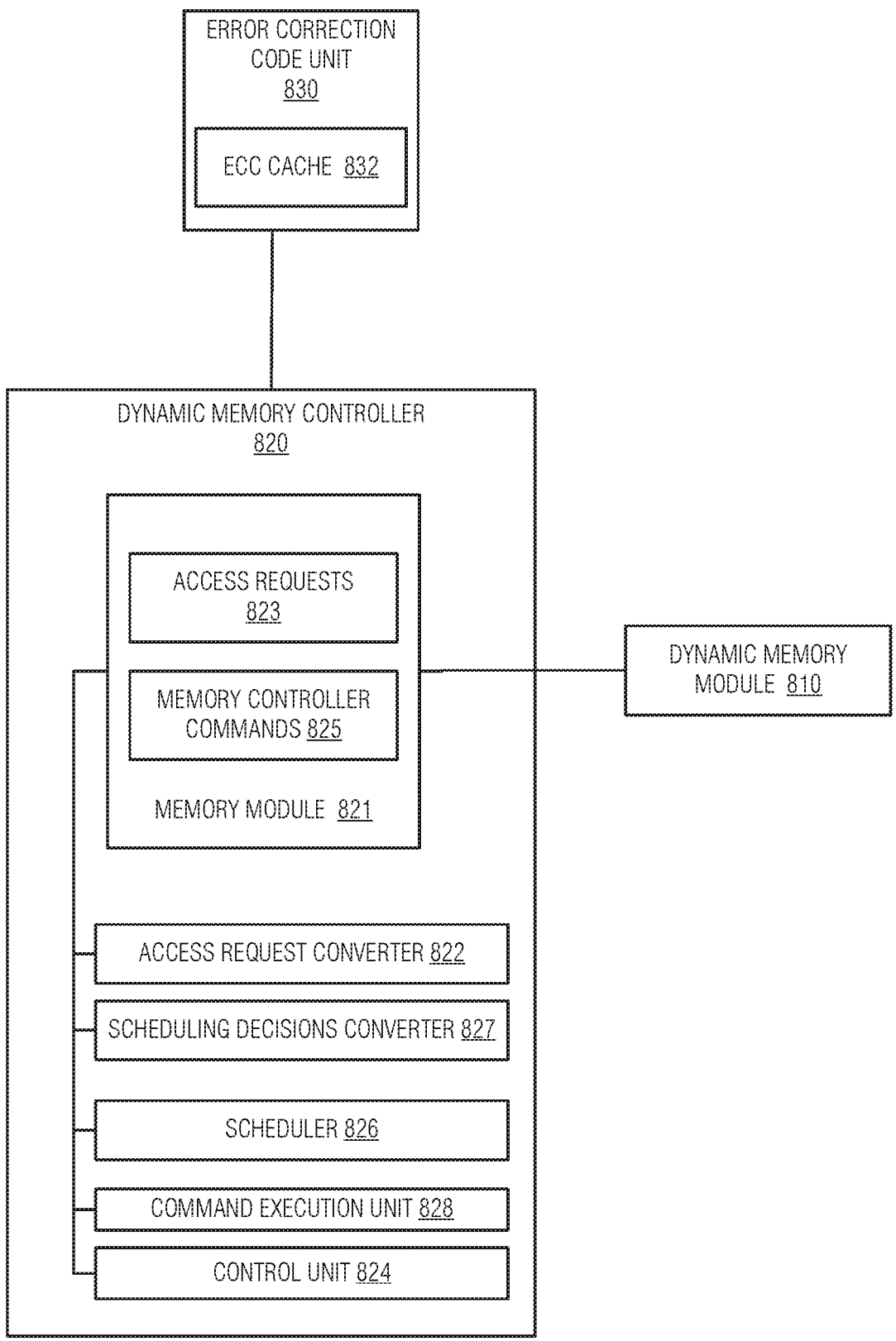
FIG. 11 illustrates a dynamic memory controller and an error correction code unit consistent with the disclosed embodiments.

FIG. 11 illustrates that the dynamic memory controller 820 may be coupled to an error correction code unit 830 that includes an ECC cache 832 for storing error correction codes sub-blocks.

Various examples of accessing a dynamic memory module and of storing ECC sub-blocks in the dynamic memory module are illustrated in PCT patent application PCT/IL2018/050431 and are illustrated in CO-PENDING application titled "ERROR CORRECTION CODING IN A DYNAMIC MEMORY MODULE".

There may be provided a method for accessing a dynamic memory module, the method may include:
1. receiving, by a memory controller, a set of access requests for accessing the dynamic memory module;
2. converting the access requests to a set of commands, wherein the set of commands comprise (a) a first sub-set of commands that are related to a first group of memory banks, and (b) a second sub-set of commands that are related to a second group of memory banks;
3. scheduling, by a scheduler of the memory controller, an execution of the first sub-set;
4. scheduling an execution of the second sub-set to be interleaved with the execution of the first sub-set; and
5. executing the set of commands according to the schedule.

The first and second groups of memory banks may belong to multiple memory, banks of the dynamic memory module; and the method may include imposing, by the dynamic memory module, a time gap between consecutive input output accesses to a same group of memory banks.

The scheduling of the execution of the first sub-set may include accessing, by the scheduler, the first sub-set without accessing, by the scheduler, the second sub-set.

The scheduling of the execution of the first sub-set may include accessing, by the scheduler, a compressed representation of the group.

The scheduling of the execution of the second sub-set may include adding, to each scheduler decision about a timing of execution of a first command of the first sub-set, another decision regarding a timing of an execution of a second command of the second sub-set, so that the execution of the second command immediately follows the execution of the first command.

The second command and the first command may have a same operand.

The converting may include generating pairs of management commands; wherein each pair of management commands comprises (a) a first management command that is associated with the first group of memory banks, and (b) a second management command that is associated with the second group of memory banks; and storing each pair of management commands in a compressed form.

The storing of each pair of management commands in the compressed form may include storing, for each pair, (a) a single management command that is associated with one of the first and second groups of memory bank, and (b) an indication that a similar command should be generated for the other group of memory banks of the first and second groups of memory bank.

The management commands may include a refresh command, a pre-charge command and an activate command.

The scheduling of the execution of the first sub-set may include grouping together access requests that are associated with a same row of a memory bank of the first group of memory bank.

The scheduling of the execution of the second sub-set may be performed by a command converter of the memory controller.

There may be provided a computer program product that stores instructions that once executed by a memory controller may cause the memory controller to execute the steps of
1. receiving a set of access requests for accessing a dynamic memory module;
2. converting the access requests to a set of commands, wherein the set of commands comprises (a) a first sub-set of commands that are related to a first group of memory banks, and (b) a second sub-set of commands that are related to a second group of memory banks;
3. scheduling, by a scheduler of the memory controller, an execution of the first sub-set;
4. scheduling an execution of the second sub-set to be interleaved with the execution of the first sub-set; and
5. executing the set of commands according to the schedule.

The first and second groups of memory banks may belong to multiple memory banks of the dynamic memory module; and the instructions may cause the memory controller to execute the steps of imposing, by the dynamic memory module, a time gap between consecutive input output accesses to a same group of memory banks.

The scheduling of the execution of the first sub-set may include accessing, by the scheduler, the first sub-set without accessing, by the scheduler, the second sub-set.

The scheduling of the execution of the first sub-set may include accessing, by the scheduler, a compressed representation of the group.

The scheduling of the execution of the second sub-set may include adding, to each scheduler decision about a timing of execution of a first command of the first sub-set, another decision regarding a timing of an execution of a second command of the second sub-set, so that the execution of the second command immediately follows the execution of the first command.

The second command and the first command may have a same operand.

The converting may include generating pairs of management commands; wherein each pair of management commands comprises (a) a first management command that is associated with the first group of memory banks, and (b) a second management command that is associated with the second group of memory banks; and storing each pair of management commands in a compressed form.

The storing of each pair of management commands in the compressed form may include storing, for each pair, (a) a single management command that is associated with one of the first and second groups of memory bank, and (b) an indication that a similar command should be generated for the other group of memory banks of the first and second groups of memory bank.

The management commands may include a refresh command, a pre-charge command and an activate command.

The scheduling of the execution of the first sub-set may include grouping together access requests that are associated with a same row of a memory bank of the first group of memory bank.

The computer program product may include instructions for scheduling the execution of the second sub-set by a command converter of the memory controller.

There may be provided a device that comprises a memory controller; wherein the memory controller is constructed and arranged to:
1. receive a set of access requests for accessing a dynamic memory module;
2. convert the access requests to a set of commands, wherein the set of commands comprise (a) a first sub-set of commands that are related to a first group of memory banks, and (b) a second sub-set of commands that are related to a second group of memory banks;
3. wherein a scheduler of the memory controller is constructed and arranged to:
4. schedule an execution of the first sub-set;
5. schedule an execution of the second sub-set to be interleaved with the execution of the first sub-set; and
6. wherein the memory controller is constructed and arranged to execute the set of commands according to the schedule.

The first and second groups of memory banks may belong to multiple memory banks of the dynamic memory module; and wherein the dynamic memory module is constructed and arranged to impose a time gap between consecutive input output accesses to a same group of memory banks.

The scheduler of the memory controller may be constructed and arranged to schedule the execution of the first sub-set by accessing the first sub-set without accessing, by the scheduler, the second sub-set.

The scheduler of the memory controller may be constructed and arranged to schedule the execution of the first sub-set by accessing a compressed representation of the group.

The scheduler of the memory controller may be constructed and arranged to schedule the execution of the second sub-set by adding, to each scheduler decision about a timing of execution of a first command of the first sub-set, another decision regarding a timing of an execution of a second command of the second sub-set, so that the execution of the second command immediately follows the execution of the first command.

The second command and the first command may have a same operand.

The memory controller may be constructed and arranged to convert the access request to commands by generating pairs of management commands; wherein each pair of management commands comprises (a) a first management command that is associated with the first group of memory banks, and (b) a second management command that is associated with the second group of memory banks; and store each pair of management commands in a compressed form.

The memory controller may be constructed and arranged to store of each pair of management commands in the compressed form by storing, for each pair, (a) a single management command that is associated with one of the first and second groups of memory bank, and (b) an indication that a similar command should be generated for the other group of memory banks of the first and second groups of memory bank.

The management commands may include a refresh command, a pre-charge command and an activate command.

The scheduler of the memory controller may be constructed and arranged to schedule the execution of the first sub-set by grouping together access requests that are associated with a same row of a memory bank of the first group of memory bank.

The memory controller may include a command converter that is constructed and arranged to schedule an execution of the second sub-set.

Any reference to a system should be applied, mutatis mutandis to a method that is executed by a system and/or to a computer program product that stores instructions that once executed by the system will cause the system to execute the method. The computer program product is non-transitory and may be, for example, an integrated circuit, a magnetic memory, an optical memory, a disk, and the like.

Any reference to method should be applied, mutatis mutandis to a system that is configured to execute the method and/or to a computer program product that stores instructions that once executed by the system will cause the system to execute the method.

Any reference to a computer program product should be applied, mutatis mutandis to a method that is executed by a system and/or a system that is configured to execute the instructions stored in the computer program product.

The term "and/or" is additionally or alternatively.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

However, other modifications, variations and alternatives are also possible. The specifications and drawings are, accordingly, to be regarded in an illustrative rather than in a restrictive sense.

The phrase "may be X" indicates that condition X may be fulfilled. This phrase also suggests that condition X may not be fulfilled. For example—any reference to a system as including a certain component should also cover the scenario in which the system does not include the certain component.

The terms "including", "comprising", "having", "consisting" and "consisting essentially of" are used in an interchangeable manner. For example—any method may include at least the steps included in the figures and/or in the specification, only the steps included in the figures and/or the specification. The same applies to the system and the mobile computer.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also for example, the examples, or portions thereof may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as "computer systems."

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word "comprising" does not exclude the presence of other elements or steps then those listed in a claim. Furthermore, the terms "a" or "an," as used herein, are defined as one as or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements the mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

Any combination of any component of any component and/or unit of system that is illustrated in any of the figures and/or specification and/or the claims may be provided.

Any combination of any system illustrated in any of the figures and/or specification and/or the claims may be provided.

Any combination of steps, operations and/or methods illustrated in any of the figures and/or specification and/or the claims may be provided.

Any combination of operations illustrated in any of the figures and/or specification and/or the claims may be provided.

Any combination of methods illustrated in any of the figures and/or specification and/or the claims may be provided.

Moreover, while illustrative embodiments have been described herein, the scope of any and all embodiments having equivalent elements, modifications, omissions, combinations (e.g., of aspects across various embodiments), adaptations and/or alterations as would be appreciated by those skilled in the art based on the present disclosure. The limitations in the claims are to be interpreted broadly based on the language employed in the claims and not limited to examples described in the present specification or during the prosecution of the application. The examples are to be construed as non-exclusive. Furthermore, the steps of the disclosed methods may be modified in any manner, including by reordering steps and/or inserting or deleting steps. It is intended, therefore, that the specification and examples be considered as illustrative only, with a true scope and spirit being indicated by the following claims and their full scope of equivalents.

What is claimed is:

1. A method for accessing a dynamic memory module, the method comprises:
   receiving, by a memory controller, a set of access requests for accessing the dynamic memory module;
   converting the access requests to a set of commands, wherein the set of commands comprise (a) a first sub-set of first management commands that are related to a first group of memory banks, and (b) a second sub-set of second management commands that are related to a second group of memory banks, wherein the first and second management commands are selected out of a refresh command, a pre-charge command, and an activate command;
   storing, in a compressed form, at least one pair of management commands that comprises a first management command and a second management command that share an opcode, wherein for each pair of the at least one pair that is stored in the compressed form, the second management command is represented by an indicator that indicates that the second management command is a duplicate of the first management command;
   scheduling, by a scheduler of the memory controller, an execution of the first sub-set;
   scheduling an execution of the second sub-set to be interleaved with the execution of the first sub-set; and
   executing the set of commands according to the schedule.

2. The method according to claim 1, wherein the first and second groups of memory banks belong to multiple memory banks of the dynamic memory module; and wherein the method comprises imposing, by the dynamic memory module, a time gap between consecutive input output accesses to a same group of memory banks.

3. The method according to claim 1, wherein the scheduling of the execution of the first sub-set comprises accessing, by the scheduler, the first sub-set without accessing, by the scheduler, the second sub-set.

4. The method according to claim 1, wherein the scheduling of the execution of the first sub-set comprises accessing, by the scheduler, the at least one pair of management commands.

5. The method according to claim 1, wherein the scheduling of the execution of the second sub-set comprises adding, to each scheduler decision about a timing of execution of a first command of the first sub-set, another decision regarding a timing of an execution of a second command of the second sub-set, so that the execution of the second command immediately follows the execution of the first command.

6. The method according to claim 1, wherein the indicator is a flag.

7. The method according to claim 1, wherein the set of commands comprises a set of pairs and wherein the at least one pair comprises only some pairs of the set of pairs.

8. The method according to claim 1, wherein the at least one pair comprises only pairs of management commands that share a pre-charge opcode or a refresh opcode.

9. The method according to claim 1, wherein first and second management commands that share an activate opcode are stored in a non-compressed form.

10. The method according to claim 1, wherein the scheduling of the execution of the first sub-set comprises grouping together access requests that are associated with a same row of a memory bank of the first group of memory bank.

11. The method according to claim 1, wherein the scheduling of the execution of the second sub-set is performed by a command converter of the memory controller.

12. A non-transitory computer program product that stores instructions that once executed by a memory controller may cause the memory controller to execute the steps of:
receiving a set of access requests for accessing a dynamic memory module;
converting the access requests to a set of commands, wherein the set of commands comprises (a) a first sub-set of first management commands that are related to a first group of memory banks, and (b) a second sub-set of second management commands that are related to a second group of memory banks, wherein the first and second management commands are selected out of a refresh command, a pre-charge command, and an activate command;
storing, in a compressed form, at least one pair of management commands that comprises a first management command and a second management command that share an opcode, wherein for each pair of the at least one pair that is stored in the compressed form, the second management command is represented by an indicator that indicates that the second management command is a duplicate of the first management command;
scheduling, by a scheduler of the memory controller, an execution of the first sub-set;
scheduling an execution of the second sub-set to be interleaved with the execution of the first sub-set; and
executing the set of commands according to the schedule.

13. A device that comprises a memory controller;
wherein the memory controller is constructed and arranged to:
receive a set of access requests for accessing a dynamic memory module;
convert the access requests to a set of commands, wherein the set of commands comprise (a) a first sub-set of first management commands that are related to a first group of memory banks, and (b) a second sub-set of second management commands that are related to a second group of memory banks, wherein the first and second management commands are selected out of a refresh command, a pre-charge command, and an activate command;
store, in a compressed form, at least one pair of management commands that comprises a first management command and a second management command that share an opcode, wherein for each pair of the at least one pair that is stored in the compressed form, the second management command is represented by an indicator that indicates that the second management command is a duplicate of the first management command;
wherein a scheduler of the memory controller is constructed and arranged to:
schedule an execution of the first sub-set;
schedule an execution of the second sub-set to be interleaved with the execution of the first sub-set; and
wherein the memory controller is constructed and arranged to execute the set of commands according to the schedule.

14. The device according to claim 13, wherein the first and second groups of memory banks belong to multiple memory banks of the dynamic memory module; and wherein the dynamic memory module is constructed and arranged to impose a time gap between consecutive input output accesses to a same group of memory banks.

15. The device according to claim 13, wherein the scheduler of the memory controller is constructed and arranged to schedule the execution of the first subset sub-set by accessing the first sub-set without accessing, by the scheduler, the second sub-set.

16. The device according to claim 13, wherein the scheduler of the memory controller is constructed and arranged to schedule the execution of the first sub-set by accessing the at least one pair of management commands.

17. The device according to claim 13, wherein the scheduler of the memory controller is constructed and arranged to schedule the execution of the second sub-set by adding, to each scheduler decision about a timing of execution of a first command of the first sub-set, another decision regarding a timing of an execution of a second command of the second sub-set, so that the execution of the second command immediately follows the execution of the first command.

18. The device according to claim 13, wherein the indicator is a flag.

19. The device according to claim 13, wherein the set of commands comprises a set of pairs and wherein the at least one pair comprises only some pairs of the set of pairs.

20. The device according to claim 13, wherein the at least one pair comprises only pairs of management commands that share a pre-charge opcode or a refresh opcode.

21. The device according to claim 13, wherein first and second management commands that share an activate opcode are stored in a non-compressed form.

22. The device according to claim 13, wherein the scheduler of the memory controller is constructed and arranged to schedule the execution of the first sub-set by grouping together access requests that are associated with a same row of a memory bank of the first group of memory bank.

23. The device according to claim 13, wherein the memory controller comprises a command converter that is constructed and arranged to schedule an execution of the second sub-set.

\* \* \* \* \*